United States Patent [19]

Matsuura et al.

[11] Patent Number: 5,274,377
[45] Date of Patent: Dec. 28, 1993

[54] PIPELINED A/D CONVERTER

[75] Inventors: Tatsuji Matsuura, Kokubunji; Eiki Imaizumi, Akishima; Kunihiko Usui, Asaka, all of Japan

[73] Assignees: Hitachi, Ltd., Chiyoda; Hitachi VLSI Engineering Corporation, Kodaira, both of Japan

[21] Appl. No.: 907,524

[22] Filed: Jul. 2, 1992

[30] Foreign Application Priority Data

Jul. 5, 1991 [JP] Japan .................. 3-165358

[51] Int. Cl.⁵ ............................................. H03M 1/42
[52] U.S. Cl. ............................ 341/161; 341/156
[58] Field of Search ............ 341/156, 161, 162, 110

[56] References Cited

U.S. PATENT DOCUMENTS

| | | | |
|---|---|---|---|
| 4,875,048 | 10/1989 | Shimizu et al. | 341/156 |
| 4,908,621 | 3/1990 | Polonio et al. | 341/120 |
| 5,043,732 | 8/1991 | Robertson et al. | 341/156 |
| 5,047,772 | 9/1991 | Ribner | 341/156 |
| 5,159,342 | 10/1992 | Yotsuyanagi | 341/161 |

OTHER PUBLICATIONS

IEEE International Solid-State Circuits Conference, pp. 210-211, 1987.

IEEE 1992 Symposium on VLSI Circuits, Seattle, WA, Jun. 3-5, 1992, pp. 98-99.

*Primary Examiner*—Marc S. Hoff
*Attorney, Agent, or Firm*—Antonelli, Terry, Stout & Kraus

[57] ABSTRACT

There is disclosed a pipelined A/D converter including a plurality of A/D-D/A sub-blocks and one A/D sub-block successively connected in cascade form to determine a conversion output by several partial bits beginning from the most significant bit. Each of A/D-D/A sub-blocks includes a sample-and-hold circuit for successively sampling and holding an input analog signal fed to the sub-block, a partial A/D converter for performing A/D conversion on a hold output of this sample-and-hold circuit, a latch circuit for latching outputs of the partial A/D converter, a D/A converter for inversely converting outputs of the latch circuit to an analog signal, and a chopper amplifier for sampling the hold output of the sample-and-hold circuit with a delay of half a period, amplifying a difference between the sampled value and the inverse conversion output of the D/A converter during a succeeding interval of amplify mode, and outputting the amplified difference to a sub-block of a succeeding stage as a conversion residue.

7 Claims, 7 Drawing Sheets

FIG. 3

| | CYCLE 1 | | CYCLE 2 | | CYCLE 3 | |
|---|---|---|---|---|---|---|
| | φ1 | φ2 | φ1 | φ2 | φ1 | φ2 |
| BLOCK 1-1 SH11 | SH | | | | | |
| A/D12 | | ADC | | | | |
| D/A13 | | | DAC | | | |
| Amp18 | | (S) | Amp | | | |
| BLOCK 1-2 SH21 | | | SH | | | |
| A/D22 | | | | ADC | | |
| D/A23 | | | | | DAC | |
| Amp28 | | | | (S) | Amp | |
| BLOCK 1-3 SH31 | | | | | | SH |
| A/D32 | | | | | | ADC |

FIG. 6    PRIOR ART

|  |  | CYCLE 1 | | CYCLE 2 | | CYCLE 3 |
|---|---|---|---|---|---|---|
|  |  | φ1 | φ2 | φ1 | φ2 | φ1 |
| BLOCK 1-1 | SH11 | S H | | | | |
|  | A/D12 | | ADC | | | |
|  | D/A13 | | DAC | | | |
|  | Amp15 | | | Amp | | |
| BLOCK 1-2 | SH21 | | | S H | | |
|  | A/D22 | | | | ADC | |
|  | D/A23 | | | | DAC | |
|  | Amp25 | | | | | Amp |
| BLOCK 1-3 | SH31 | | | | S H | |
|  | A/D32 | | | | | ADC |

FIG. 8

| | | CYCLE 1 | | CYCLE 2 | | CYCLE 3 | |
|---|---|---|---|---|---|---|---|
| | | φ1 | φ2 | φ1 | φ2 | φ1 | φ2 |
| BLOCK 1-1 | SH 10 | S | H | | | | |
| | A/D 12 | | ADC | | | | |
| | D/A 13 | | | DAC | | | |
| | SH 17 | | | H | S | | |
| | Amp 18 | | | | (S) Amp | | |
| BLOCK 1-2 | A/D 22 | | | | ADC | | |
| | D/A 23 | | | | | DAC | |
| | SH 27 | | | | | H | S |
| | Amp 28 | | | | | | (S) Amp |
| 1-3 | A/D 32 | | | | | | ADC |

FIG. 10

| | CYCLE 1 | | CYCLE 2 | | CYCLE 3 | | CYCLE 4 | | CYCLE 5 |
|---|---|---|---|---|---|---|---|---|---|
| | φ1 | φ2 | φ1 | φ2 | φ1 | φ2 | φ1 | φ2 | φ1 |
| BLOCK 1-1 SH11 | S | H | S | H | S | H | S | H | S |
| A/D12 | | ADC | | ADC | | ADC | | ADC | |
| D/A13 | | | DAC | | DAC | | DAC | | DAC |
| SH17 | | S | H | S | H | S | H | S | H |
| Amp18 | | | S | Amp | S | Amp | S | Amp | S |
| BLOCK 1-2 SH21 | | | S | H | S | H | S | H | S |
| A/D22 | | | | ADC | | ADC | | ADC | |
| D/A32 | | | | | DAC | | DAC | | DAC |
| SH27 | | | | | S | H | S | H | S |
| Amp28 | | | | | | S | Amp | S | Amp |
| BLOCK 1-3 SH31 | | | | | | | S | H | S |
| A/D32 | | | | | | | | ADC | |

PIPELINED A/D CONVERTER

BACKGROUND OF THE INVENTION

The present invention relates to an A/D converter for converting analog signals to digital signals, and in particular to a pipelined A/D converter having a cascade connection of A/D-D/A sub-blocks respectively for determining partial bits of a conversion output.

Conventionally, as an A/D converter for realizing a high-speed conversion rate, a flash-type A/D converter is known. This A/D converter has 2n voltage comparators (where n is the number of output bits) and all output bits are determined simultaneously.

An example of an A/D converter having a conversion rate comparable to that of the flash-type A/D converter and reduced in circuit size and power dissipation is described in 1987 IEEE International Solid-State Circuits Conference, pp. 210-211. This A/D converter is called "pipelined A/D converter" and has a cascade connection of a plurality of A/D-D/A sub-blocks each having a flash-type A/D converter with a small number of bits. An A/D-D/A sub-block of a first stage determines several high-order bits of the output, inversely converts that conversion output to an analog signal, derives a difference (conversion residue) between the resultant analog signal and the input analog signal before conversion, amplifies the difference, and transfers the amplified difference to an A/D-D/A sub-block of a succeeding stage. The A/D-D/A sub-block of the succeeding stage performs A/D conversion on the transferred signal, determines several succeeding bits, and performs inverse conversion, derivation of a residue signal and amplification. By connecting a plurality of A/D-D/A sub-block stages in a cascade form and disposing a sample-and-hold circuit for the A/D conversion input of each stage, conversion processing is advanced in a pipeline form every several bits from the higher order. In this pipelined A/D converter, the time taken for a certain analog value to be converted becomes the time required for that sample value to pass through all blocks. On the other hand, however, the conversion rate is determined substantially by the conversion time of each block and hence a comparatively high conversion rate can be attained. Further, as compared with a pipelined A/D converter having an enormous number of voltage comparators, the number of voltage comparators can be substantially reduced and power dissipation can be reduced.

Although a two-step parallel A/D converter described in U.S. Pat. No. 4,875,048 has two block stages, it has nearly the same structure as that of the above described pipelined A/D converter.

SUMMARY OF THE INVENTION

The above described conventional pipelined A/D converter has such a configuration that at an intermediate time phase of one sampling period executed by a sample-and-hold circuit of an A/D-D/A sub-block of the first stage, a sample-and-hold circuit of an A/D-D/A sub-block of the succeeding stage performs sampling. A sample-and-hold circuit of an A/D-D/A sub-block of a third stage performs sampling on a conversion residue of a second time of the analog value, which has been sampled at the first stage, with a delay of one sampling period as compared with the A/D-D/A sub-block of the first stage. During an interval of half a period of the A/D conversion rate, therefore, each A/D-D/A sub-block must complete all of four steps, i.e., determination of all partial bits in its charge, inverse conversion of the result, derivation of a difference between the input analog value and the result of the inverse conversion, and amplification of the difference. In this pipelined A/D converter, therefore, the conversion rate is limited to a frequency determined by the limit of the operation speed of the device used in the A/D-D/A sub-block.

For example, for A/D converters used for portable video apparatuses driven by batteries, resolution of approximately 10 bits and a conversion rate of at least approximately 10 MHz are demanded and power dissipation must be low as possible. In the above described conventional pipelined A/D converter, a sub A/D converter, a sub D/A converter and an amplifier forming each A/D-D/A sub-block must be high in operation speed and hence power dissipation cannot be made sufficiently small.

Therefore, an object of the present invention is to provide a pipelined A/D converter which is high in conversion precision and conversion rate and which is lower in power dissipation than the conventional one.

Another object of the present invention is to provide a pipelined A/D converter having a higher conversion rate than the conventional one.

In accordance with the present invention, each A/D-D/A sub-block includes a sample-and-hold circuit for receiving an input analog signal to be converted, repeatedly executing one operation period having a sample mode and a hold mode, and continuously outputting an input value, which is obtained at the last time point in an interval of sample mode, in a succeeding hold mode. The A/D-D/A sub-block further includes a chopper amplifier functioning with a delay of half a period, as compared with the operation of the above described sample, hold circuit and having a sample-and-hold function of sampling the hold value of the above described sample-and-hold circuit connected to a first input terminal at the last time point in a sample mode interval and amplifying and outputting in the succeeding amplify mode a difference between the sampled value and a value obtained by inversely converting the conversion result of partial bits connected to a second input terminal. That is to say, this is equivalent to two sample-and-hold means having a difference of half a period in sampling time point and inserted in the propagation route of the analog signal of the A/D-D/A sub-block. Therefore, an A/D-D/A sub-block of a succeeding stage receiving a conversion residue from the chopper amplifier samples the conversion residue with a delay of one period of conversion rate as compared with the A/D-D/A sub-block yielding this conversion residue and functions in the same way.

To be more concrete, a typical pipelined A/D converter according to the present invention includes a cascade connection of a plurality of A/D-D/A sub-blocks and one A/D sub-block. Each of the above described A/D-D/A sub-blocks includes a sample-and-hold circuit for sampling and holding the input signal, a sub A/D converter for performing A/D conversion on the held output of this sample-and-hold circuit and determining partial bits of the conversion output, a latch circuit for latching outputs of the above described sub A/D converter while the above described sample-and-hold circuit is in the hold mode, a D/A converter for performing D/A conversion on the outputs of the above described sub A/D converter latched by the above described latch circuit, and a chopper amplifier having a sample-and-hold function of sampling the held output of the above described sample-and-hold circuit with a delay of half a period as compared with the sampling time of the above described sample-and-hold circuit, of amplifying in a succeeding amplify mode interval a difference between the sampled value and the output of the above described D/A converter, and of transferring the amplified difference to a succeeding stage as a conversion residue. The above described A/D sub-block includes a sample-and-hold circuit for sampling and holding the conversion residue supplied from a chopper amplifier of an A/D-D/A sub-block of a preceding stage and a sub A/D converter for performing A/D conversion on the held output of the sample-and-hold circuit and determining partial bits of the conversion output.

Another typical pipelined A/D converter according to the present invention includes a cascade connection of an input sample-and-hold circuit for performing sample-and-hold function on an analog signal, which is to be converted, at intervals of a predetermined sampling period, a plurality of A/D-D/A sub-block stages, and one A/D sub-block. Each of the above described A/D-D/A sub-blocks includes a sample-and-hold circuit for sampling and holding the input signal, a sub A/D converter for performing A/D on the above described input signal and determining partial bits of the conversion output, a latch circuit for latching outputs of the above described sub A/D converter, a D/A converter for performing D/A conversion on the output of the above described sub A/D converter latched by the above described latch circuit, and a chopper amplifier having a sample-and-hold function of sampling the hold output of the above described sample-and-hold circuit with a delay of half a period as compared with the sampling time of the above described sample-and-hold circuit and of amplifying in a succeeding amplify mode interval a difference between the sampled value and the output of the above described D/A converter, and of transferring the amplified difference to a succeeding stage as a conversion residue. The above described A/D sub-block includes a sub A/D converter for performing A/D conversion on the conversion residue supplied from a chopper amplifier of an A/D-D/A sub-block of the preceding stage and determining partial bits of the conversion output.

Further, a configuration including three sample-and-hold means delayed in sampling time by half a period and substantially inserted in the propagation route of the analog signal of an A/D-D/A sub-block may also be used. The configuration of its typical example includes a cascade connection of a plurality of A/D-D/A sub-block stages and one A/D sub-block. Each of the above described A/D-D/A sub-blocks includes a first sample-and-hold circuit for sampling and holding an input signal, a sub A/D converter for performing A/D conversion on the hold output of the first sample-and-hold circuit and determining partial bits of the conversion output, a latch circuit for latching outputs of the above described sub A/D converter while the above described first sample-and-hold circuit is in the hold mode, a D/A converter for performing D/A conversion on the outputs of the above described sub A/D converter latched by the above described latch circuit, a second sample-and-hold circuit for sampling and holding the hold output of the above described first sample-and-hold circuit with a delay of half a period, and a chopper amplifier having a sample-and-hold function of sampling the hold output of the above described second sample-and-hold circuit with a further delay of half a period as compared with its sampling time point, of amplifying a difference between the sampled value and the output of the above described D/A converter in a succeeding interval of amplify mode, and of transferring the amplified difference to a succeeding stage as a conversion residue. The above described A/D sub-block includes a sample-and-hold circuit for sampling and holding the conversion reside supplied from a chopper amplifier of an A/D-D/A sub-block of a preceding stage, and a sub A/D converter for performing A/D conversion on the hold output of the sample-and-hold circuit and determining partial bits of the conversion output. In case of this configuration, an A/D-D/A sub-block of a succeeding stage receiving the conversion residue supplied from the chopper amplifier samples the conversion residue with a delay of 1.5 periods of the conversion rate as compared with the A/D/DA sub-block supplying this conversion residue and determines partial bits.

The above described chopper amplifier having the sample-and-hold function includes a capacitor connected between an input changeover switch and an input terminal of an amplifier and an output capacitor inserted in a feedback circuit. The amplification factor of the chopper amplifier is determined by the capacitance ratio of the capacitors. As compared with common amplifiers of continuous operation, this amplifier has a reduced error of amplification factor and reduced power dissipation. Further, in the above described present invention, the amplification operation of this chopper amplifier and conversion operation of the D/A converter need only be completed during an interval of sample mode belonging to a period succeeding the period of the sample mode and hold mode of the above described sample-and-hold circuit. Therefore, a demand for operation speed upon the sub A/D converter, D/A converter, and chopper amplifier is moderated, and circuits dissipating lower power can be adopted as them. The present invention thus makes it possible to realize a pipelined A/D converter with extremely small power dissipation while maintaining a conversion rate. Or a pipelined A/D converter having a higher conversion rate can be realized.

BRIEF DESCRIPTION OF THE DRAWINGS

FIG. 3 is a diagram showing operation timing of the embodiment of FIG. 1;

FIG. 6 is a diagram showing operation timing of the conventional pipelined A/D converter;

FIG. 8 is a diagram showing operation timing of the embodiment of FIG. 6;

FIG. 10 is a diagram showing operation timing of the embodiment of FIG. 8.

DESCRIPTION OF THE PREFERRED EMBODIMENTS

Figure 1:
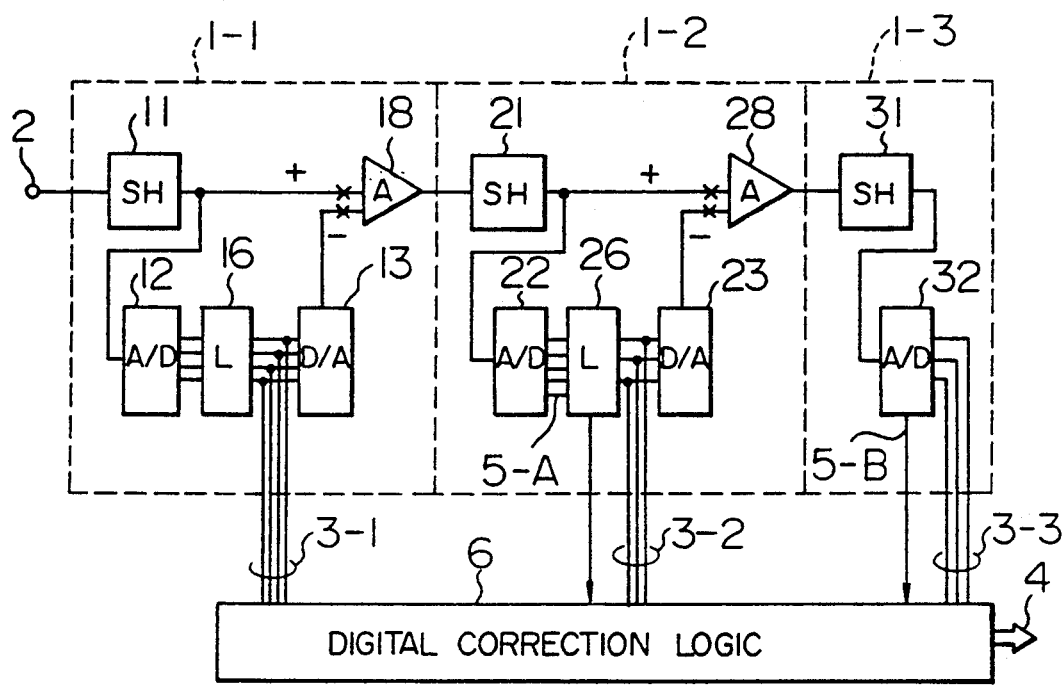
FIG. 1 is a block diagram showing an embodiment of the present invention.

FIG. 1 shows the configuration of a pipelined A/D converter of a first embodiment of the present invention, in which 10-bit conversion is performed by dividing 10 bits into 4 high-order bits, 3 middle-order bits, and 3 low-order bits and carrying out conversion. A first block 1-1 is an A/D-D/A sub-block for carrying out conversion of 4 high-order bits. Simultaneous with the receiving of an analog signal to be converted and outputting of the result of conversion of 4 high-order bits, the first block 1-1 functions to produce a signal representing the difference between the input analog signal and the conversion result for the 4 bits, amplify the difference, and output the amplified difference to the next block. That is, an analog signal inputted to a terminal 2 is first sampled by a sample-and-hold circuit 11, and held and output from the circuit 11 at the next timing. This held output is converted into a digital signal by a sub A/D converter 12 having a structure of a 4-bit flash-type A/D converter, digital outputs corresponding to 4 high-order bits being thus obtained. This conversion result is latched by a latch circuit 16 at time near the end of a hold mode interval of the sample-and-hold circuit 11 whereat the conversion result has been definitely fixed. The latched 4-bit digital outputs are restored to an analog value by a D/A converter 13. A chopper amplifier 18 having a sample-and-hold function samples the held output of the sample-and-hold circuit 11 at the same time as the latch timing of the latch circuit 16 and amplifies a difference between the sampled value and the output or the D/A converter 13 in a succeeding amplify mode. The amplified difference signal is output to the next block. The difference signal before being amplified is called conversion residue and it is a signal component left without being converted when the input analog signal has undergone 4-bit coarse quantization. Comparing to division, this corresponds to the remainder obtained when the input signal is divided by a quantization level.

This remainder can be more finely quantized further by defining one quantization level included in the first 4-bit quantization as full scale and performing quantization again with finer quantization levels. This second quantization is performed by a succeeding A/D-D/A sub-block 1-2. The A/D-D/A sub-block 1-2 includes a sample-and-hold circuit 21 for sampling and holding the conversion residue amplified by the chopper amplifier 18, a 3-bit sub A/D converter 22 for quantizing the held output, a latch circuit 26, a D/A converter 23, and a chopper amplifier 28 having a sample-and-hold function. The A/D-D/A sub-block 1-2 conducts the same processing as that of the block 1-1 on the output signal, i.e., the conversion residue fed from the preceding block. The full scale of the sub A/D converter 22 corresponds to one quantization level of 4-bit quantization in the A/D-D/A sub-block 1-1. A conversion output having 3 bits succeeding the above described 4 high-order bits is thus obtained from the sub A/D converter 22. Therefore, the output signal of the amplifier 28 becomes the conversion residue obtained when the original analog value has been quantized with 7 bits.

The last block 1-3 is an A/D sub-block for obtaining the 3 least significant bits by performing 3-bit A/D on the conversion residue of the second time a amplified by the chopper amplifier 28. That is to say, the A/D sub-block 1-3 includes a sample-and-hold circuit 31 for sampling and holding the conversion residue fed from the amplifier 28 and a 3-bit sub A/D converter 32 for quantizing the held output of the sample-and-hold circuit 31.

Partial conversion outputs 3-1, 3-2 and 3-3 having 4 bits, 3 bits and 3 bits, respectively, obtained from these A/D-DA sub-blocks and the A/D sub-block are transferred to a digital correction logic 6. Further, an additional output 5-A is issued from the partial A/D converter 22 and transferred to the digital correction logic 6. An additional output 5-B is issued from the partial A/D converter 32 and transferred to the digital correction logic 6. That is to say, the partial A/D converters 22 and 32 are converters called "3+1-bit flash-type A/D converters". The A/D converter of this type has some extra conversion levels for further outputting "001", "010", "011" and so on even when the input exceeds a value corresponding to "111". In the same way, the A/D converter of this type has some extra conversion levels for further outputting "111", "110", "101" and so on below the conversion level of "000" as well. Further, whether the input level has been within the range of full scale ranging from "000" to "111" of 3-bit A/D conversion or has gotten out of the range is indicated by a 1-bit additional output. The partial A/D converters 22 and 32 are 3-bit A/D converters, respectively. When an input level of the converter 22 or 32 falls within the original full scale range from "000" to "111" of the 3-bit A/D conversion, additional output 5-A or 5-B of the converters 22 or 32, respectively, is equal to "0 or LOW level. When the input level exceeds the full scale range, the additional output 5-A or 5-B is equal to "1" or HIGH level. Further, the extra conversion levels become significant when the additional output 5-A or 5-B is "1" or HIGH level. Whether the input level has been located above the full scale or located below the full scale is indicated by the most significant bit included in the 3-bit conversion output.

Figure 2:
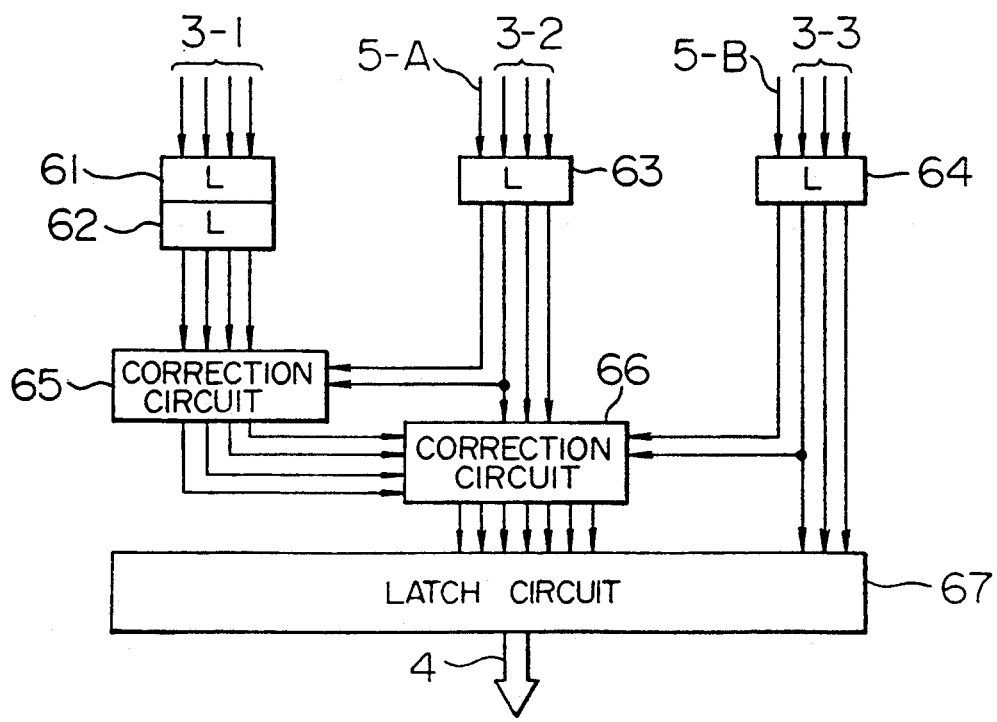
FIG. 2 is a detailed block diagram of a block shown in FIG. 1.

The concrete configuration of the digital correction logic 6 is shown in FIG. 2. The partial conversion outputs 3-1 are latched successively by latch circuits 61 and 62. In addition, the partial conversion outputs 3-2 and the additional output 5-A are latched by a latch circuit 63. The partial conversion outputs 3-3 and the additional output 5-B are latched by a latch circuit 64. Thereby the time difference between outputs of sub-blocks is first removed. A correction circuit 65 makes a correction upon the partial conversion outputs 3-1 obtained via the latch circuit 62 as shown in the following table. In response to the additional output 5-B and the most significant bit of the partial conversion output 3-3, a correction circuit 66 also makes a correction upon the partial conversion outputs 3-2 in exactly the same way.

| Level of 5-A | Level of the most significant bit of outputs 3-2 | Correction value for outputs 3-1 |
| --- | --- | --- |
| 0 | 0, 1 | 0 |
| 1 | 0 | +1 |
| 1 | 1 | −1 |

Even if there is disagreement between the level of the conversion residue produced by a A/D-D/A sub-block and the level of the full scale of the sub A/D converter for performing A/D conversion on that conversion residue, a conversion error produced thereby can be modified by the above described correction. Respective corrected partial conversion outputs are latched by a latch circuit 67. A final conversion result 4 having 10 bits is thus obtained.

The operation timing of the embodiment shown in FIG. 1 will now be described by referring to FIG. 3 Clock periods are represented by cycle 1, 2, 3, ... and $\phi_1$ and $\phi_2$ denote the former half and the latter half of a two-phase clock. In general, the clock need not be a two-phase clock, but clock timing divided into 1-$\phi_1$, 1-$\phi_2$, 2-$\phi_1$, 2-$\phi_2$, ... may be considered. At the end timing of clock 1-$\phi_1$, the sample-and-hold circuit 11 of the block 1-1 samples an analog signal. During an interval of the next clock 1-$\phi_2$, the sample-and-hold circuit 11 is the hold mode and the sub A/D converter 12 performs A/D conversion on that held signal. At the end time of 1-$\phi_2$, the latch circuit 16 latches the output of the sub A/D converter 12 and the chopper amplifier 18 samples the output of the sample-and-hold circuit 11. During the interval of clock 2-$\phi_1$ in the next cycle, a signal is supplied from the latch circuit 16 to the D/A converter 13 and D/A conversion is performed. In addition, the chopper amplifier 18 comes into the amplify mode, amplifies the difference between the sampled value and the output of the D/A converter 13, and outputs the amplified difference. The blocks 1-2 and 1-3 function with delays of one cycle and two cycles as compared with the block 1-1, respectively.

Figure 4:
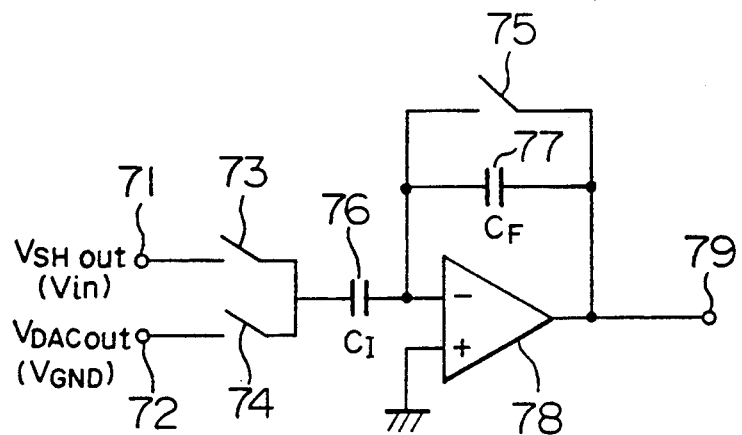
FIG. 4 is a circuit diagram showing an example of a chopper amplifier used in the embodiment.

FIG. 4 shows circuit configuration of each of the chopper amplifiers 18 and 28 each having a sample-and-hold function for amplifying the conversion residue. First and second input terminals 71 and 72 are connected to an input capacitor 76 having capacitance $C_I$ via switches 73 and 74. A feedback capacitor 77 having capacitance $C_F$ is connected to an operational amplifier 78. In a sample mode or a reset mode, a switch 75 is short-circuited to discharge the feedback capacitor 77. Further, the switch 73 is on and the switch 74 is off. The input capacitor 76 is charged so as to follow the level of the first input at the terminal 71. Thereafter, the switches 73 and 75 are turned off and the switch 74 is turned on. The circuit passes into the amplify mode. The moment the switch 73 is turned off, the level of the first input to the input capacitor 76 is sampled by the input capacitor 76. When the switch 75 turns off and the switch 74 turns on in the amplify mode, the electric charge moves according to the level difference between the sampled level of the first input and the level of a second input applied to a second input terminal 72. At this time, the operational amplifier 78 charges the feedback capacitor 77 so as not to cause a voltage change at an inverting input terminal of the operational amplifier 78. At an output terminal 79, therefore, a voltage obtained by amplifying the above described level difference by $C_I/C_F$ times appears.

As for the chopper amplifier 18 of FIG. 1, the output of the sample-and-hold circuit 11 is connected to the first input terminal 71 and the output of the D/A converter 13 is connected to the second input terminal 72. The same may be said of the chopper amplifier 28. Further, sample-and-hold circuits 11, 21 and 31 also have exactly the same structure as that of FIG. 4. In case it is used as a sample-and-hold circuit, however, the second input terminal 72 is connected to ground potential $V_{GND}$ or a predetermined reference potential. In case the gain should be unity, the capacitance ratio $C_I/C_F$ is made equal to unity.

Figure 5:
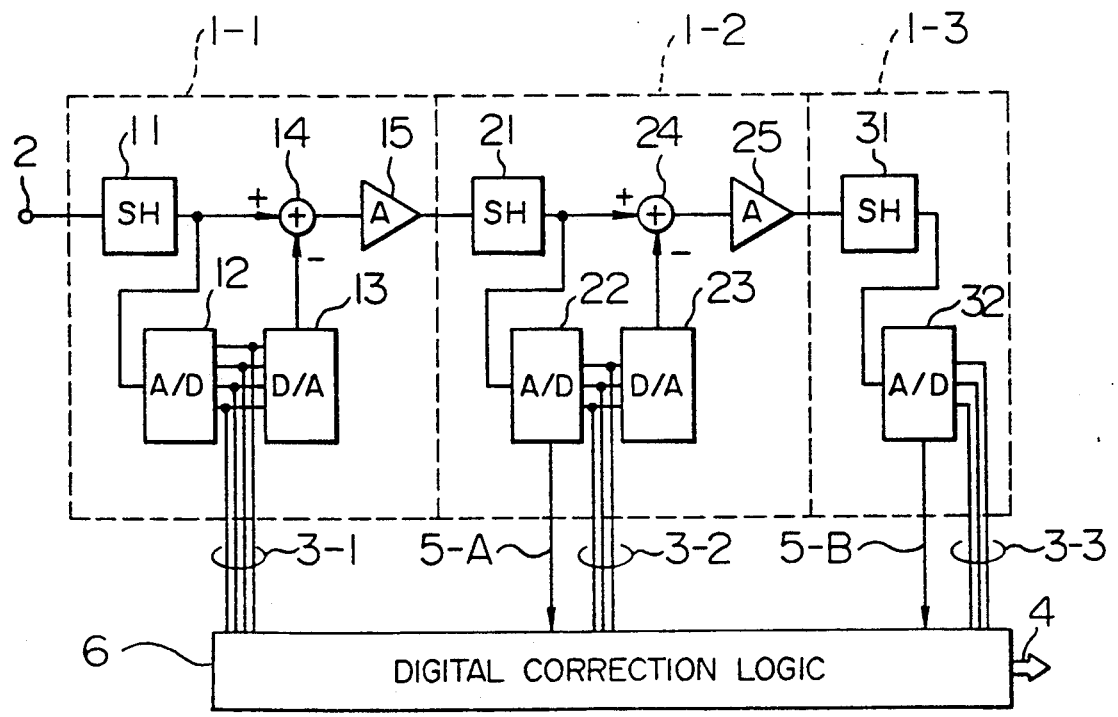
FIG. 5 is a block diagram showing a conventional pipelined A/D converter.

For comparison with the above described embodiment, FIG. 5 shows the configuration of a pipelined A/D converter of the prior art described in 1987 IEEE International Solid-State Circuits, pp. 210–211. In the same way as FIG. 1, A/D conversion of 10 bits in total is carried out by two A/D-DA sub-blocks 1-1 and 1-2 and one A/D sub-block 1-3. However, the output of the partial A/D converter 12 is directly connected to the D/A converter 13. Further, means for deriving the conversion residue includes a subtracter 14 and an amplifier 15. In the A/D-D/A sub-block 1-2 as well, the output of the partial A/D converter 22 is directly connected to the D/A converter 23. The conversion residue is obtained by using a subtracter 24 and an amplifier 25. FIG. 6 shows pipelined conversion operation which can be carried out by sing such a configuration of the prior art. The sample-and-hold circuit 11 is brought into the sample mode by the clock 1-$\phi_1$ and brought into the hold mode by the clock 1-$\phi_2$. That is to say, the input signal is sampled at the end time of the clock 1$\phi_1$ and the output is held during 1-$\phi_2$. During this hold interval, the following operations are carried out one after another.

(1) The sub A/D converter 12 performs A/D conversion on that held signal;

(2) The D/A converter 13 converts the digital output of the sub A/D converter 12 to an analog value;

(3) The subtracter 14 and the amplifier 15 subtract the analog signal produced by the D/A converter from the input analog signal held and output by the sample-and-hold circuit 11 and amplify a resultant difference signal; and (4) Finally, the sample-and-hold circuit 21 in the next block samples the amplified conversion residue. During the interval of the next clock 2-$\phi_1$, the sample-and-hold circuit comes into the sample mode for subsequent sampling. Further, the sample-and-hold circuit 21 included in the A/D-D/A sub-block 1-2 holds the conversion residue sampled by the above described operation (4). That is to say, the second Å/D-D/A sub-block 1-2 operates with a delay of half a period as compared with the first A/D-D/A sub-block 1-1. The A/D sub-block 1 3 operates with a further delay of half a period. Since the above described operations (1) to (4) are successively conducted during the interval of half a period, this long signal path becomes a critical path in the pipelined A/D converter of the prior art shown in FIG. 5 and hence the clock cannot be quickened sufficiently.

In the pipelined A/D converter of FIG. 1, however, a sample-and-hold circuit and a chopper amplifier, which conducts a periodic operation of a sample interval and an amplify interval similar to the periodic operation of the sample interval and amplify interval of the sample-and-hold circuit with a delay of half a period, are inserted in cascade form. Corresponding to this, a latch circuit is inserted on the output side of the partial A/D converter. Out of the above described operations of four kinds, therefore, the operations of (2), (3) and (4) need only be completed in the next sample interval after the hold interval of the sample-and-hold circuit has expired. As compared with the sample period, i.e., the conversion rate of the sample-and-hold circuit 11 and so on, therefore, demand for the operation speed of the partial A/D converter, D/A converter and amplifier is moderated. Thus, circuits with low power dissipation can be adopted therefore.

Figure 7:
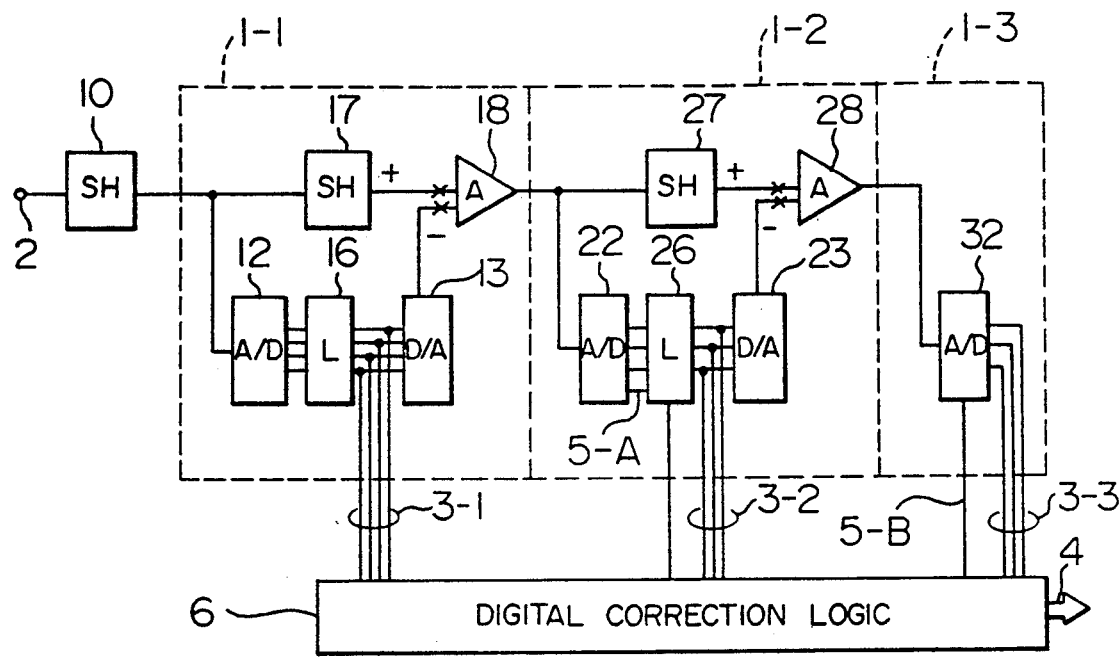
FIG. 7 is a block diagram showing another embodiment of the present invention.

FIG. 7 is a block diagram of a second embodiment of the present invention. This embodiment differs from the embodiment of FIG. 1 in that the analog input to the block is directly connected to the partial A/D converter 12 of the A/D-DA sub-block 1-1. To each of the partial A/D converter 22 of the A/D-D/A sub-block 1-2 and the partial A/D converter 32 of the D/A sub-block 1-3 as well, an input signal to each sub-block is directly connected in the same way. To each of the chopper amplifiers 18 and 28 having a sample-and-hold function for calculating and amplifying the conversion residue, however, a block input signal is coupled via a sample-and-hold circuit 17 or 27. That is to say, substantially two stages of sample-and-hold means are inserted in the analog signal path of each A/D-D/A sub-block in the same way as the embodiment of FIG. 1. In addition, an input sample-and-hold circuit 10 for sampling and holding an analog signal to be converted is added in a stage preceding the A/D-D/A sub-block 1-1. Components denoted by the same characters as those of FIG. 1 have configurations identical with those of components of the embodiment of FIG. 1.

Operation of the pipelined A/D converter of FIG. 7 will now be described by referring to FIG. 8. During the clock interval 1-$\phi_1$, the input sample-and-hold circuit 10 is in the sample mode and the signal is sampled immediately before switching to the next clock interval 1-$\phi_2$. During the clock interval 1-$\phi_2$ with the input sample-and-hold circuit 10 being in the hold mode, the partial A/D converter 12 of the block 1-1 carries out 4-bit A/D conversion. Toward the end of that interval 1-$\phi_2$, the latch circuit latches the outputs of the partial A/D converter 12 and the sample-and-hold circuit 17 samples the hold output of the input sample-and-hold circuit 10. During the clock interval 2-$\phi_1$ of the next period, the sample-and-hold circuit 17 is in the hold mode. Toward the end of that interval 2-$\phi_1$, the chopper amplifier 18 samples the hold output of the sample-and-hold circuit 17. During the next clock interval 2-$\phi_2$, the chopper amplifier 18 is in the amplify mode and amplifies the difference between the sampled value of the original input signal and the output value of the D/A converter 13 and generates an amplified conversion residue. Each component in the block 1-2 conducts operation similar to that of the block 1-1 with a delay of one period and generates a conversion residue in the A/D conversion of the middle 3 bits. The partial A/D converter in the block 1-3 operates with a further delay of one period and performs A/D conversion on the conversion residue, which is fed from the chopper amplifier 28, during clock interval 3-$\phi_2$.

In the embodiment of FIG. 7 as well, the inverse conversion operation of the D/A converter and amplification operation of the chopper amplifier in each A/D-DA sub-block thus need only be completed within the next interval of sample mode after the sample mode of the sample-and-hold circuit has terminated.

Figure 9:
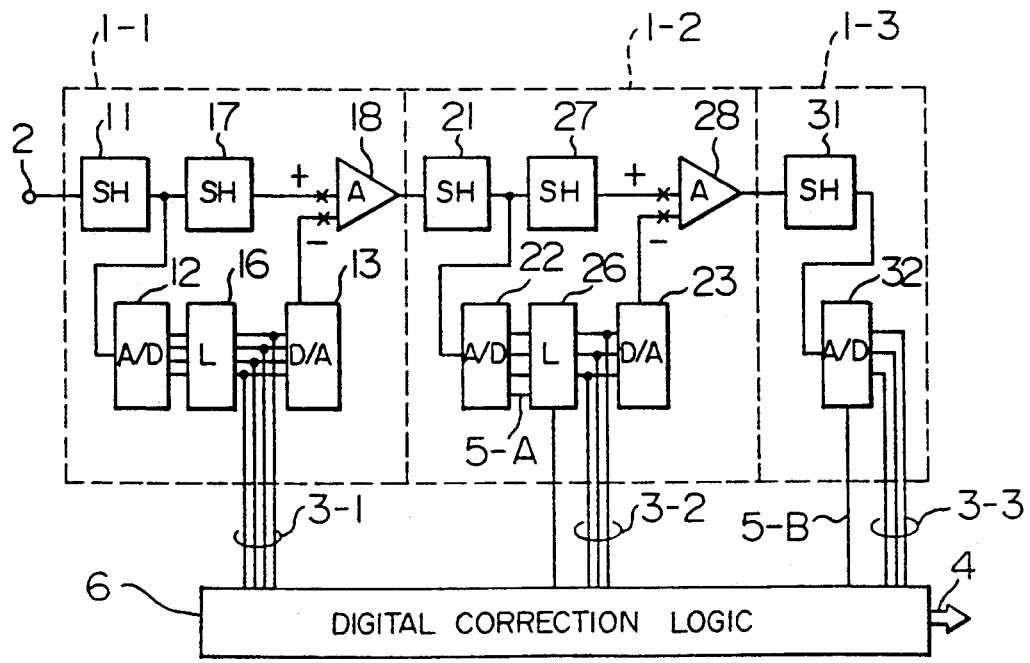
FIG. 9 is a block diagram of still another embodiment of the present invention.

FIG. 9 shows a third embodiment of the present invention. In the present embodiment, sample-and-hold circuits 17 and 27 operating with a further delay of half a period are added to the A/D-D/A sub-blocks 1-1 and 1-2 of the embodiment of FIG. 1 in a stage succeeding the sample-and-hold circuits 11 and 21. Operation of components of the embodiment shown in FIG. 9 will now be described by referring to FIG. 10. The sample-and-hold circuit 11 of the block 1-1 is in the sample mode during the clock interval 1-$\phi_1$ and it is in the hold mode during the clock interval 1-$\phi_2$. During the interval 1-$\phi_2$, the hold output of the sample-and-hold circuit 11 is subjected to A/D conversion in the partial A/D converter 12. Toward the end of the interval 1-$\phi_2$, the hold output of the sample-and-hold circuit 11 is sampled by the sample-and-hold circuit 17. Further, the conversion outputs of the partial A/D converter 12 are latched by the latch circuit 16. At the end of the clock interval 2-$\phi_1$ of the next period, the sample-and-hold circuit 11 performs the next sampling and the chopper amplifier 18 samples the hold output of the sample-and-hold circuit 17. During the next clock interval 2-$\phi_2$, the chopper amplifier 18 is in the amplify mode and amplifies the difference between the sampled analog value and the inverse conversion output of the D/A converter 13 to generate an amplified conversion residue. The second sub-block 1-2 conducts operations of sampling, partial A/D conversion, inverse conversion, and conversion residue amplification with a delay of 1.5 periods as compared with the sub-block 1-1. The A/D sub-block 1-3 carries out partial A/D conversion with a further delay of 1.5 periods.

In the present embodiment, demands for operation speeds upon components are further moderated as compared with the embodiments of FIGS. 1 and 7. However, the delay from application of the input analog signal until generation of the conversion result becomes longer than that of the embodiments of FIGS. 1 and 7.

Assuming that every analog circuit has a single-end form, the embodiments have heretofore been described. However, those embodiments can also be realized by using full-differential type. From the viewpoint of noise resistance it is more desirable to adopt circuits of full-differential type.

The present invention makes it possible to conduct the conversion operation of a partial A/D converter, operation of a D/A converter, sampling for obtaining a conversion residue, and amplification operation of the conversion residue by using respective different timing signals. Therefore, the clock period can be shortened and a high conversion rate can be realized.

In addition, circuits with low power dissipation can be adopted as sample-and-hold circuits, partial A/D converters, D/A converters, and chopper amplifiers. Therefore, an A/D converter having extremely low power dissipation can be realized.

We claim:

1. A pipelined A/D converter for converting an input analog signal to a digital signal with a predetermined conversion rate and producing a conversion output with a predetermined number of bits, said pipelined A/D converter comprising:
   a plurality of A/D-D/A sub-blocks and one A/D sub-block successively connected in cascade form to determine outputs thereof by several partial bits of the conversion output beginning from the most significant bit;
   each of said plurality of A/D-D/A sub-blocks comprising a sample-and-hold circuit for successively sampling an input signal fed to said sub-block with a period corresponding to said conversion rate and for holding a resultant value, a sub A/D converter for converting a hold output of said sample-and-hold circuit to a digital signal, a latch circuit for latching outputs of said sub A/D converter during an interval of hold mode of said sample-and-hold circuit, a D/A converter for converting outputs of said latch circuit to an analog signal, and a chopper amplifier for sampling a hold output of said sample-and-hold circuit with a delay of half a period as compared with sample timing of said sample-and-hold circuit, amplifying a difference between the sampled value and an output of said D/A converter during a succeeding interval of an amplify mode, and transferring the amplified difference to a sub-block of a succeeding stage as a conversion residue; and said A/D sub-block comprising a sample-and-hold circuit for sampling the conversion residue transferred from the chopper amplifier of the A/D-D/A sub-block of a preceding stage and a sub A/D converter for converting a hold output of said sample-and-hold circuit to a digital signal.

2. A pipelined A/D converter according to claim 1, wherein each of said plurality of A/D-DA sub-blocks and one A/D sub-block, to which a conversion residue is transferred from a sub-block of a preceding stage, conducts conversion operation on a certain sampled value of said input analog signal with a delay of one period as compared with a sub-block of a preceding stage.

3. A pipelined A/D converter for converting an input analog signal to a digital signal with a predetermined conversion rate and producing a conversion output with a predetermined number of bits, said pipelined A/D converter comprising:

an input sample-and-hold circuit for successively sampling said input analog signal with a period corresponding to said conversion rate and holding a resultant value;

a plurality of A/D-D/A sub-blocks and one A/D sub-block successively connected in cascade form so as to follow said input sample-and-hold circuit to determine outputs thereof by several partial bits of the conversion output beginning from the most significant bit;

each of said plurality of A/D-D/A sub-blocks comprising a sample-and-hold circuit for successively sampling an input signal fed to said sub-block with a period corresponding to said conversion rate and for holding a resultant value, a sub A/D converter for converting the input signal fed to said sub-block to a digital signal, a latch circuit for latching outputs of said sub A/D converter, a D/A converter for converting outputs of said latch circuit to an analog signal, and a chopper amplifier for sampling a hold output of said sample-and-hold circuit with a delay of half a period as compared with sample timing of said sample-and-hold circuit, amplifying a difference between the sampled value and an output of said D/A converter during a succeeding interval of amplify mode, and transferring the amplified difference to a sub-block of a succeeding stage as a conversion residue; and said A/D sub-block comprising a sub A/D converter for converting the conversion residue transferred from the chopper amplifier of the A/D-D/A sub-block of a preceding stage to a digital signal.

4. A pipelined A/D converter according to claim 3, wherein each of said plurality of A/D-D/A sub-blocks and one A/D sub-block, to which a conversion residue is transferred from a sub-block of a preceding stage, conducts conversion operation on a certain sampled value of said input analog signal with a delay of one period as compared with a sub-block of a preceding stage.

5. A pipelined A/D converter according to claim 3, wherein a chopper amplifier in each of said plurality of A/D-D/A sub-blocks conducts sample operation with a delay of one period as compared with a chopper amplifier in an A/D-D/A sub-block of a preceding stage or said input sample-and-hold circuit of a preceding stage.

6. A pipelined A/D converter for converting an input analog signal to a digital signal with a predetermined conversion rate and producing a conversion output with a predetermined number of bits, said pipelined A/D converter comprising:

a plurality of A/D-D/A sub-blocks and one A/D sub-block successively connected in cascade form to determine outputs thereof by several partial bits of the conversion output beginning from the most significant bit;

each of said plurality of A/D-D/A sub-blocks comprising a first sample-and-hold circuit for successively sampling an input signal fed to said sub-block with a period corresponding to said conversion rate and for holding a resultant value, a sub A/D converter for converting a hold output of said first sample-and-hold circuit to a digital signal, a latch circuit for latching outputs of said sub A/D converter during an interval of hold mode of said first sample-and-hold circuit, a D/A converter for converting outputs of said latch circuit to an analog signal, a second sample-and-hold circuit for sampling the hold output of said first sample-and-hold circuit with a delay of half a period as compared with sample timing of said first sample-and-hold circuit, and a chopper amplifier for sampling a hold output of said second sample-and-hold circuit with a further delay of half a period as compared with sample timing of said second sample-and-hold circuit, amplifying a difference between the sampled value and an output of said D/A converter during a succeeding interval of amplify mode, and transferring the amplified difference to a sub-block of a succeeding stage as a conversion residue; and said A/D sub-block comprising a sample-and-hold circuit for sampling the conversion residue transferred from the chopper amplifier of the A/D-D/A sub-bock of a preceding stage and a sub A/D converter for converting a hold output of said sample-and-hold circuit to a digital signal.

7. A pipelined A/D converter according to claim 6, wherein each of said plurality of A/D-D/A sub-blocks and one A/D sub-block, to which a conversion residue is transferred from a sub-block of a preceding stage, conducts conversion operation on a certain sampled value of said input analog signal with a delay of 1.5 periods as compared with a sub-block of a preceding stage.

* * * * *